United States Patent [19]
Naraki

[11] Patent Number: 5,386,152
[45] Date of Patent: Jan. 31, 1995

[54] POWER-ON RESET CIRCUIT RESPONSIVE TO A CLOCK SIGNAL

[75] Inventor: Toshinari Naraki, Tokyo, Japan

[73] Assignee: Oki Electric Industry Co., Ltd., Tokyo, Japan

[21] Appl. No.: 32,298

[22] Filed: Mar. 17, 1993

[30] Foreign Application Priority Data

Mar. 18, 1992 [JP] Japan ................................ 4-062301

[51] Int. Cl.⁶ .......................................... H03K 17/22
[52] U.S. Cl. ..................................... 327/143; 377/128; 327/26; 327/78; 327/94; 327/335
[58] Field of Search ............ 307/234, 246, 263, 272.3, 307/296.4, 353, 510, 517, 354; 328/127; 377/118, 119, 121

[56] References Cited

U.S. PATENT DOCUMENTS

| | | | |
|---|---|---|---|
| 4,434,403 | 2/1984 | Chang | 307/296.4 |
| 4,464,584 | 8/1984 | Hentzschel et al. | 307/296.4 |
| 4,518,865 | 5/1985 | Iwasaki | 307/296.4 |
| 4,900,950 | 2/1990 | Dubujet | 307/272.3 |
| 5,159,217 | 7/1991 | Mortensen et al. | 307/272.3 |

FOREIGN PATENT DOCUMENTS

| | | | |
|---|---|---|---|
| 0116816 | 7/1983 | Japan | 307/272.3 |
| 0051624 | 3/1984 | Japan | 307/272.3 |

OTHER PUBLICATIONS

IBM Tech. Discl. Bultn. "Microprocessor Monitor and Reset Circuit", Jul. 1986, vol. 29 #2, p. 611.

Primary Examiner—Timothy P. Callahan
Assistant Examiner—Terry D. Cunningham
Attorney, Agent, or Firm—Spencer, Frank & Schneider

[57] ABSTRACT

A power-on reset circuit includes a differentiator circuit, a sample-hold circuit and a reset signal generating circuit. The differentiator circuit differentiates a clock signal from an oscillator after a power supply is applied to a power supply terminal. The sample-hold circuit samples a power component only from the output of the differentiator circuit. When the power component exceeds a threshold voltage of the reset signal generating circuit, the reset signal generating circuit generates and provides a reset signal for a logic circuit during a certain period.

13 Claims, 3 Drawing Sheets

POWER-ON RESET CIRCUIT RESPONSIVE TO A CLOCK SIGNAL

REFERENCE TO RELATED APPLICATIONS

This invention claims the right of priority under 35 U.S.C. 119 of Japanese Patent Application Serial No. 4-62301, filed on Mar. 18, 1992, the entire disclosure of which is incorporated herein by reference.

TECHNICAL FIELD

The present invention pertains in general to a computer or an electric devices, and more particularly to a power-on reset circuit formed on a semiconductor substrate for providing a reset signal during a certain period of time for logic circuits in response to a clock signal which is generated by an oscillator.

BACKGROUND OF THE INVENTION

Logic circuits are operated by a clock signal provided by an oscillator. A power-on reset circuit is generally connected to the logic circuits. The power-on reset circuit provides a reset signal for the logic circuits until the power supply voltage reaches a predetermined level.

A prior art power-on reset circuit has a capacitor and a resistor for setting a time constant. A resistor having a certain resistance is connected in series with the capacitor between a power supply terminal and ground. An inverter which provides a reset signal for the logic circuit, is connected to the logic circuit and a node N which is located on a connecting point of the resistor and the capacitor.

When the power supply voltage is applied to the power supply terminal, the logic circuit and the resistor are provided with the power supply voltage, and the logic circuit receives a clock signal from an oscillator. At the same time, the node N is at the "L" level because the capacitor does not have enough charge. Accordingly the inverter inverts the "L" level signal to a "H" level signal, that is, a reset signal. The logic circuit therefore is reset by the reset signal.

Then, the capacitor is charged by electrons from the power supply terminal via the resistor, and the electrical potential of the node N becomes to rise. When the electrical potential of the node N becomes higher than a threshold voltage Vt of the inverter, the inverter output the "L'" level signal. Therefore, the reset condition of the logic circuit is canceled. The logic circuit then starts to operate in response to the clock signal.

The reset period of the reset circuit is defined by the time constant, which is from the moment of applying the power supply voltage to the power supply terminal to the moment of canceling the reset condition of the logic circuit. The time constant depend on the product of the resistance of the resistor by the capacitance of the capacitor.

The prior art power-on reset circuit, however, has some problems as follows;

(1) The resistance and the capacitance are required to be approximately a few MΩ and 0.1 μF respectively if the power-on reset circuit is to have a satisfactory reset period. If a capacitor having a capacitance of 0.1 μF is formed on a semiconductor substrate, it occupies a large area of the semiconductor substrate.

(2) The logic circuit is operated in response to the clock signal which is generated in an internal or an external oscillator circuit. It sometimes occurs that the logic circuit does not receive the clock signal for some reasons in spite of applying the power supply voltage to the power supply terminal. In the prior art power-on reset circuit, since the reset signal is canceled after a predetermined period, another reset signal must be provided for the logic circuit to reset the logic circuit after a clock signal is applied to it. The circuit is complicated in that another reset signal is provided for the logic circuit after the clock signal is applied to it.

SUMMARY OF THE INVENTION

It is an object of the invention to provide a power-on reset circuit which is formed within a small area of a semiconductor substrate.

It is another object of the invention to provide a power-on reset circuit which generates a reset signal for a logic circuit in response to a clock signal from an oscillator.

Still another object of the invention is to provide a logic circuit driving system which resets the logic circuit without a complicated operation.

These and other objectives are accomplished in accordance with the present invention by providing a power-on reset circuit which is driven by the clock signal from the oscillator. The power-on reset circuit comprises (a) a differentiator circuit connected to the oscillator for differentiating a clock signal from the oscillator to generate a first output signal, (b) a sample-hold circuit connected to the differentiator circuit for sampling and holding the first output signal to generate a second output signal, and (c) a reset signal generating circuit having a predetermined threshold voltage connected between the sample-hold circuit and the logic circuit for generating the reset signal until an electric potential of the second output signal exceeds the threshold voltage thereof.

Furthermore, the objects of the preset invention are fulfilled by providing a logic circuit driving system having a logic circuit which is driven by a clock signal comprising;

(a) an oscillator for starting to generate a clock signal when a power supply voltage is applied thereto, (b) a differentiator circuit for receiving and differentiating the clock signal from the oscillator, (c) a sample-hold circuit connected to the differentiator circuit for sampling and holding an output from the differentiator circuit, and (d) a reset signal generating circuit having a predetermined threshold voltage connected between the sample-hold circuit and the logic circuit for generating a reset signal from the time when the power supply voltage is applied to the oscillator to the time when an electric potential of the output of the sample-hold circuit exceeds the threshold voltage thereof.

BRIEF DESCRIPTION OF THE DRAWINGS

Other objectives and many of the attendant advantages of the present invention will be readily apparent as the invention becomes better understood by reference to the following detailed description and with the appended claims, when considered in conjunction with the accompanying drawings, wherein;

DETAILED DESCRIPTION OF THE INVENTION

1. The First Embodiment

Figure 1:
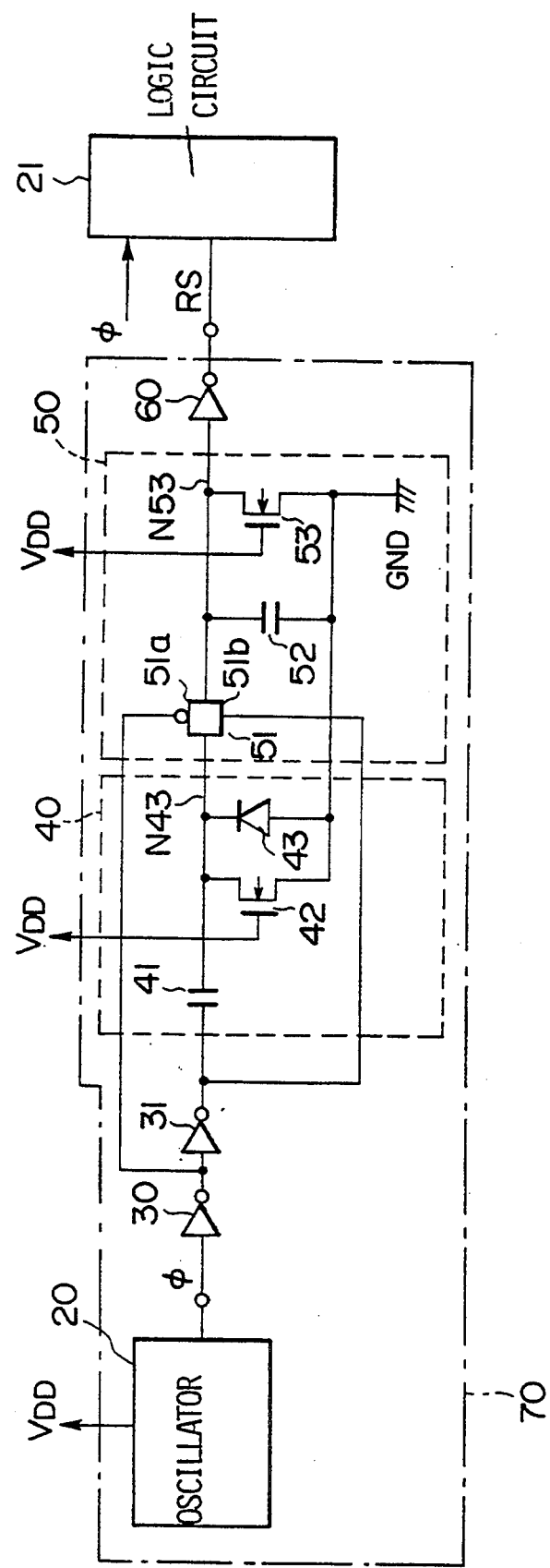
FIG. 1 is a schematic diagram of the power-on reset circuit according to a first embodiment of the present invention.

Referring now FIG. 1, a power-on reset circuit formed on a semiconductor substrate comprises a differentiator circuit 40, a sample-hold circuit 50, first and second inverters 30, 31 and a reset signal generating circuit 60: e.g. an inverter, which has a predetermined threshold voltage Vt.

The differentiator circuit 40 is connected to a crystal oscillator 20 which is operated in response to the application of a power supply voltage VDD via the first and second inverters 30, 31. The sample-hold circuit 50 is connected to the differentiator circuit 40 and the input port of the reset signal generating circuit 60. The output port of the reset signal generating circuit 60 is connected to the logic circuit 21 which is operated in response to the clock signal from the oscillator 20. The first inverter 30 and the second inverter 31 are connected in series. Namely, the first inverter 30 causes the clock signal from the oscillator 20 to reverse, the second inverter 31 causes the inverted clock signal to re-reverse.

The oscillator 20 provides a clock signal for the first inverter 30 and logic circuit 21. The differentiator circuit 40 has a time constant circuit and a clamp diode 43. The time constant circuit comprises a capacitor 41 and an NMOS transistor 42 acting as a bias resistor. The differentiator circuit 40 receives the re-inverted the clock signal after it has been re-inverted by the second inverter 31, differentiates the re-inverted clock signal, and then provides a signal as a result of the differentiation for the sample-hold circuit 50 via a node N43 at an output port of the differentiator circuit 40. The output port of the second inverter 31 is connected to the node N43 via the capacitor 41. The drain electrode of the NMOS transistor 42 and the cathode electrode of the diode 43 are connected to the node N43. The power supply voltage VDD is applied to the gate of the NMOS transistor 42. The source of the NMOS transistor 42 and the anode electrode of the diode 43 are commonly connected to ground GND.

The sample-hold circuit 50 samples and holds the output signal of the differentiator circuit 40. The sample-hold circuit 50 has an analog switch 51 for sampling and an integrating circuit. The analog switch 51 comprises a PMOS transistor 51a turned ON/OFF by the output from the first inverter 30 and an NMOS transistor 51b turned ON/OFF by the output from the second inverter 31. The analog switch 51 is connected between the node N43 and a node N53 which is an output port of the sample-hold circuit 50. The integrating circuit comprises a capacitor 52 and an NMOS transistor 53 acting as a bias resistor. The capacitor 52 is connected between the node N53 and ground GND. The NMOS transistor 53 is also connected between the node N53 and ground GND. The power supply voltage VDD is applied to the gate of the NMOS transistor 53.

The reset signal generating circuit 60 is connected between the node N53 and the logic circuit 21. An inverter could be adopted for the reset signal generating circuit 60. The reset signal generating circuit 60 inverts the output signal from the sample-hold circuit 50 so as to provide a reset signal RS for the logic circuit 21.

Figure 2:
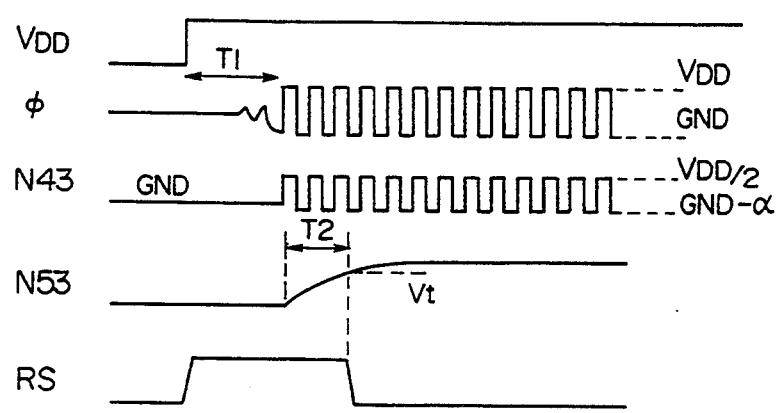
FIG. 2 illustrates a voltage waveforms of the circuit of FIG. 1.

The operation of FIG. 1 is explained in detail referring to FIG. 2 illustrated the voltage waveforms of FIG. 1.

When the power supply voltage VDD is applied to the oscillator 20, it generates the clock signal after a certain period T1: e.g. a few milliseconds. Until the clock signal is generated, the node N43 is held at ground level by the NMOS transistor 42. The clock signal is inverted by the first inverter 30. The inverted clock signal is again inverted by second inverter 31. The inverted clock signal and the re-inverted clock signal are provided for the gate electrode of the PMOS transistor 51a and the gate electrode of the NMOS transistor 51b respectively.

The re-inverted clock signal is also provided for the differentiator circuit 40. In the differential circuit 40, the re-inverted clock signal is differentiated by the capacitor 41 and the NMOS transistor 42. The diode 43 clamps the differentiated signal. The sample-hold circuit 50 receives the output signal of differentiator circuit 40 which is a pulse signal having an electric potential of the range from a maximum of approximately VDD/2 to a minimum of GND-α, where α is the voltage drop across the diode 43.

The node N53 as an output node of the sample-hold circuit 50 is also held at ground level by the NMOS transistor 53 until the clock signal is generated. After the clock signal is generated, the analog switch 51 is turned on by the inverted clock signal and the re-inverted clock signal having a GND level and a VDD level respectively. Therefore, the output from the differentiator circuit 40 is sampled, and then the capacitor 52 is charged with electrons. When the clock signal is at the GND level, the electrons are held in the capacitor 52 because the analog switch 51 is held in a nonconductive state by the clock signal which is at GND level. The electric potential on the node N53 depends on the time constant which is a product of the on-state resistance of the analog switch 51 and the capacitance of the capacitor 52.

The reset signal generating circuit 60 receives the output signal of the sample-hold circuit 50, and then inverts the signal and provides it to the logic circuit 21 as the reset signal RS. The reset signal RS is generated when the threshold voltage Vt of the reset signal generating circuit 60 is higher than the electric potential on the node N53 of the sample-hold circuit 50. Namely, by applying the power supply, the logic circuit 21 is reset after a certain period has passed. When the electric potential on the node N53 of the sample-hold circuit 50 become higher than the threshold voltage Vt, the reset signal RS is canceled since the signal on the node N53 goes to the "H" level. The time T2 of the time constant in the sample-hold circuit is determined by the capacitor 52 and the NMOS transistor 53. Consequently, after the power supply is applied to the oscillator 20, the reset signal RS is at the "H" level during the time (T1+T2), and then goes to the "L" level since the clock signal is generated.

In general, the reset signal RS is generated within a few milliseconds after applying the power supply voltage VDD to the oscillator 20. In the present invention, the clock signal is generated after a few milliseconds have passed from the time when the power supply voltage VDD is applied to the oscillator 20. This period, that is T1, depends on a contraction of the oscillator. Because the reset signal RS is generated in response to the clock signal in the present invention, the time period T2 depends on the capacitance of the capacitor 52 and the resistance of the NMOS transistor 53 and may be shorter than the time period T1. In the present circuit, the capacitors 41, 52 may each have capacitances of a few pF.

In the case that the oscillator 20 does not generate a clock signal for some reasons although the power supply voltage is applied to it, the reset signal RS is provided for the logic circuit 21 until the time T2 has passed after a new clock signal is provided for the logic circuit 21.

According to the present invention, since the reset signal RS is generated in response to the clock signal from the oscillator 20, the capacitors 41, 52 may have a small capacitance. Therefore, a power-on reset circuit can be formed in a small area of the semiconductor substrate.

Furthermore, since the reset signal RS is generated in response to the clock signal from the oscillator 20, the logic circuit 21 stay in the reset state if the oscillator 20 does not generate any clock signals for some reasons although the power supply voltage is applied to the oscillator 20. Therefore, the logic circuit 21 is controlled by information related only to whether the clock signal is generated or not. When the clock signal is generated, the logic circuit 21 performs accurately without any special operation being required for resetting the logic circuit 21.

The present embodiment has many variations. For example, the reset signal generating circuit 60 could be formed in the logic circuit 21. Further, a logic circuit driving system 70 could be manufactured on the same semiconductor substrate, which has the oscillator 21, the inverters 30, 31, the differential circuit 40, the sample-hold circuit 50 and the reset signal generating circuit 60.

2. The Second Embodiment

Figure 3:
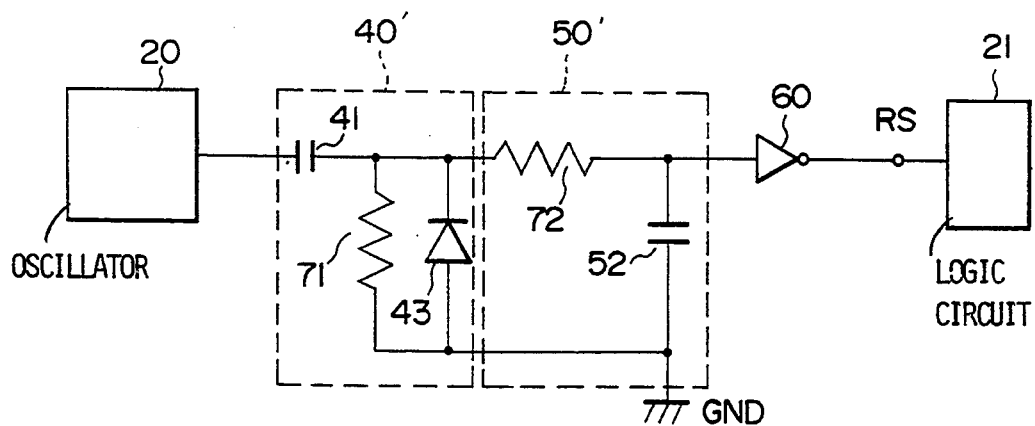
FIG. 3 is a schematic diagram of the power-on reset circuit according to a second embodiment of the present invention.

The second embodiment is illustrated in FIG. 3. Referring to FIG. 3, there are two important differences between the first embodiment and the second embodiment. In the second embodiment, a differentiator circuit 40' has a clamp diode 43, a capacitor 41 and a first resistor 71, and a sample-hold circuit 50' has a capacitor 52 and a second resistor 72. Namely, it is possible to replace the NMOS transistors in the differentiator circuit and the analog switch in the sample-hold circuit of the first embodiment with the first and second resistors 71 and 72. Because the MOS transistors are replaced with the first and second resistors, the inverters 30 and 31 are not required in the second embodiment. Therefore, the power-on reset circuit in the second embodiment could be manufactured with a simple circuit construction.

3. The Third Embodiment

Figure 4:
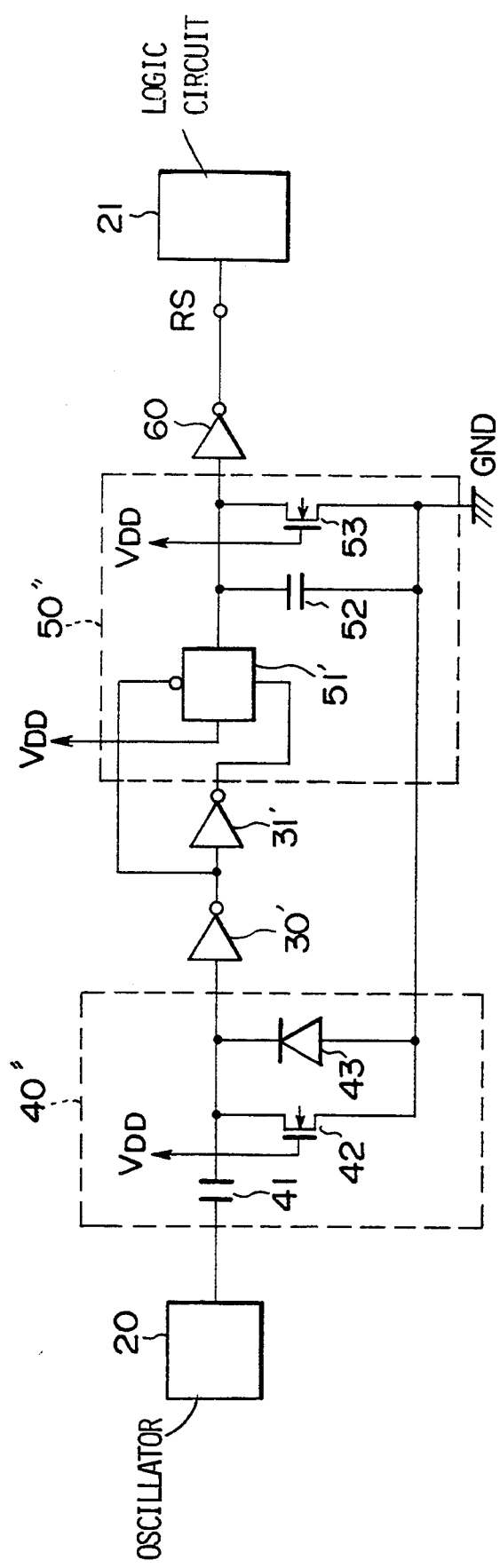
FIG. 4 is a schematic diagram of the power-on reset circuit according to a third embodiment of the present invention.

The third embodiment is illustrated in FIG. 4. Referring to FIG. 4, a set of inverters 30' and 31' are disposed between a differentiator circuit 40" and a sample-hold circuit 50". A power supply voltage VDD is applied to an input of an analog switch 51' in the sample-hold circuit 50". In the third embodiment, it is easy to control the threshold voltage Vt of the reset signal generating circuit 60.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein. The most important characteristic of the present invention is that the power-on reset circuit generates the reset signal by the clock signal from the oscillator.

We claim:

1. A power-on reset circuit operably coupled between an oscillator and a logic circuit for generating a reset signal comprising:
   (a) a first inverter connected to the oscillator for inverting a clock signal from the oscillator;
   (b) a second inverter connected in series with the first inverter, said second inverter re-inverting the clock signal inverted by said first inverter to provide a re-inverted clock signal;
   (c) a differentiator circuit connected to the second inverter for differentiating the re-inverted clock signal from the second inverter;
   (d) a sample-hold circuit connected to the differentiator circuit for sampling and holding an output from the differentiator circuit, the sample-hold circuit having an analog switch which comprises an NMOS transistor and a PMOS transistor connected to an output node of the differentiator circuit, the PMOS transistor having a gate which is connected to the output of the first inverter and the NMOS transistor having a gate which is connected to the output of the second inverter; and
   (e) a reset signal generating circuit having a predetermined threshold voltage connected between the sample-hold circuit and the logic circuit for generating the reset signal until an electric potential at an output of the sample-hold circuit exceeds the threshold voltage of said reset signal generating circuit.

2. A power-on reset circuit operably coupled between an oscillator and a logic circuit for generating a reset signal comprising:
   (a) a differentiator circuit connected to the oscillator for differentiating a clock signal from the oscillator, the differentiator circuit having a first capacitor, a first NMOS transistor and a clamp circuit, the first capacitor operably coupling an output node of the differentiator circuit and the oscillator, the first NMOS transistor having a gate for receiving a power supply voltage, a drain connected to the output node of the differentiator circuit and a source connected to ground, the clamp circuit clamping an electric potential at the output node of the differentiator circuit;
   (b) a sample-hold circuit connected to the differentiator circuit for sampling and holding an output from the differentiator circuit, the sample-hold circuit having an analog switch which is turned on by the clock signal, a second capacitor and a second NMOS transistor, the second capacitor being connected between an output node of the sample-hold circuit and ground, and the second NMOS transistor having a gate for receiving the power supply voltage, a drain connected to the output node of the sample-hold circuit and a source connected to ground; and (c) a reset signal generating circuit having a predetermined threshold voltage connected between the sample-hold circuit and the logic circuit for generating the reset signal until an electric potential at the output node of the sample-hold circuit exceeds the threshold voltage of said reset signal generating circuit.

3. A power-on reset circuit operably coupled between an oscillator and a logic circuit for generating a reset signal as set forth in claim 2, wherein the clamp circuit is a diode.

4. A power-on reset circuit operably coupled between an oscillator and a logic circuit for generating a reset signal as set forth in claim 2, wherein the reset signal generating circuit is an inverter.

5. A power-on reset circuit operably coupled between an oscillator and a logic circuit for generating a reset signal as set forth in claim 2, wherein the magnitude of the capacitance of each of said first and second capacitors is in the picofarad range.

6. A power-on reset circuit operably coupled between an oscillator and a logic circuit for generating a reset signal as set forth in claim 2, wherein the oscillator is a crystal oscillator.

7. A power-on reset circuit operably coupled between an oscillator and a logic circuit for generating a reset signal comprising:

(a) a differentiator circuit connected to the oscillator for differentiating a clock signal;

(b) a first inverter connected to the differentiator circuit for inverting a signal from the differentiator circuit;

(c) a second inverter connected in series with the first inverter;

(d) a sample-hold circuit having an analog switch, a first input of said analog switch being connected to a power supply voltage, a second input of said analog switch being connected to an output of the first inverter and a third input of said analog switch being connected to the output of the second inverter; and (e) a reset signal generating circuit having a predetermined threshold voltage connected between the sample-hold circuit and the logic circuit for generating the reset signal until an electric potential at an output of the sample-hold circuit exceeds the threshold voltage of said reset signal generating circuit.

8. A power-on reset circuit as set forth in claim 7 wherein said analog switch comprises a PMOS transistor and an NMOS transistor, a gate of said PMOS transistor being connected to the output of said first inverter and a gate of said NMOS transistor being connected to the output of said second inverter.

9. A power-on reset circuit as set forth in claim 7 wherein said differentiator circuit comprises a first capacitor connected between an output of said oscillator and an input of said first inverter, a first transistor and a clamping circuit, said first transistor and said clamping circuit being connected in parallel between a junction of said capacitor and the input of said first inverter and ground.

10. A power-on reset circuit as set forth in claim 9 wherein said sample-hold circuit further comprises a second capacitor and a second transistor connected in parallel between an output of said analog switch and ground.

11. A power-on reset circuit as set forth in claim 9 wherein said clamping circuit is a diode.

12. A power-on reset circuit as set forth in claim 9 wherein said reset signal generating circuit is an inverter.

13. A power-on reset circuit operably coupled between an oscillator and a logic circuit for generating a reset signal comprising:

a differentiator circuit connected to the oscillator for differentiating a clock signal from the oscillator to generate a first output signal;

a sample-hold circuit comprising
a switching circuit connected to the differentiator circuit for outputting the first output signal in response to the clock signal, and
a holding circuit connected to the switching circuit for holding the first output signal to generate a second output signal; and a reset signal generating circuit having a predetermined threshold voltage connected between the holding circuit and the logic circuit for generating the reset signal until an electric potential of the second output signal exceeds the threshold voltage of said reset signal generating circuit.

* * * * *